United States Patent
Kawasaki

(10) Patent No.: US 8,030,691 B2
(45) Date of Patent: Oct. 4, 2011

(54) SEMICONDUCTOR DEVICE AND MANUFACTURING METHOD THEREFOR

(75) Inventor: Hisao Kawasaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 235 days.

(21) Appl. No.: 12/045,304

(22) Filed: Mar. 10, 2008

(65) Prior Publication Data

US 2008/0230813 A1 Sep. 25, 2008

(30) Foreign Application Priority Data

Mar. 19, 2007 (JP) ................. 2007-070052

(51) Int. Cl.
*H01L 29/80* (2006.01)
*H01L 31/112* (2006.01)
*H01L 21/338* (2006.01)

(52) U.S. Cl. ......... 257/277; 257/E21.697; 257/E27.012; 257/E27.081; 438/171

(58) Field of Classification Search ................. 438/171; 257/277, E27.012, E27.081, E21.697
See application file for complete search history.

(56) References Cited

U.S. PATENT DOCUMENTS

| | | | |
|---|---|---|---|
| 4,789,645 A | 12/1988 | Calviello et al. | |
| 4,959,705 A * | 9/1990 | Lemnios et al. | 257/532 |
| 5,382,821 A * | 1/1995 | Nakajima | 257/401 |
| 5,552,335 A | 9/1996 | Mahon et al. | |
| 5,714,410 A * | 2/1998 | Kim | 438/199 |
| 5,882,946 A | 3/1999 | Otani | |
| 6,075,266 A * | 6/2000 | Yoshitomi | 257/306 |
| 6,246,084 B1* | 6/2001 | Kim | 257/296 |
| 6,762,109 B2* | 7/2004 | Murata | 438/396 |
| 6,940,127 B2 | 9/2005 | Yokogawa | |
| 2005/0127393 A1* | 6/2005 | Kurokawa | 257/103 |

FOREIGN PATENT DOCUMENTS

| | | |
|---|---|---|
| JP | 1-264250 | 10/1989 |
| JP | 3-76262 | 4/1991 |
| JP | 3-225861 | 10/1991 |
| JP | 8-340083 | 12/1996 |
| JP | 10050720 A * | 2/1998 |
| JP | 10-247721 | 9/1998 |
| JP | 2001-15693 | 1/2001 |
| JP | 2001-24155 | 1/2001 |
| JP | 2002-184946 | 6/2002 |
| JP | 2003-124234 | 4/2003 |

OTHER PUBLICATIONS

"Self-Aligned Dummy Gate Sidewall-Spaced MESFET"; Dec. 1, 1985; IBM Technical Disclosure Bulletin, vol. 28, Issue 7, p. 2767-2768.*

Office Action issued Mar. 16, 2010 in Japanese Application No. 2007-070052.

* cited by examiner

*Primary Examiner* — David S Blum

(74) *Attorney, Agent, or Firm* — Oblon, Spivak, McClelland, Maier & Neustadt, L.L.P.

(57) ABSTRACT

An MMIC 100 is a semiconductor device which includes an FET formed on a GaAs substrate 10 and an MIM capacitor having a dielectric layer 20b arranged between a lower electrode 18b and an upper electrode 22b. A method for manufacturing the MMIC 100 is provided, in which a source electrode 16a and a drain electrode 16b of the FET are formed and then a gate electrode 18a of the FET and a lower electrode 18b of the MIM capacitor are formed simultaneously by the lift-off method.

14 Claims, 3 Drawing Sheets

SEMICONDUCTOR DEVICE AND MANUFACTURING METHOD THEREFOR

CROSS-REFERENCE TO RELATED APPLICATIONS

This application is based upon and claims the benefit of priority from the prior Japanese Patent Application No. 2007-70052, filed on Mar. 19, 2007; the entire contents of which are incorporated herein by reference.

TECHNICAL FIELD

The present invention relates to a microwave monolithic integrated circuit (hereinafter abbreviated as MMIC) using a compound semiconductor substrate and more particular to a semiconductor device having an active element and a metal-insulator-metal (hereinafter abbreviated as MIM) capacitor and to a manufacturing method therefor.

BACKGROUND ART

In the microwave monolithic integrated circuit using a compound semiconductor substrate, conventionally, on the same compound semiconductor substrate such as GaAs, an active element such as a field effect transistor (hereinafter, abbreviated as an FET) and an MIM capacitor as a passive element are formed. (Refer to FIG. 1, Japanese Patent Application 2002-184946).

In conventional processes for manufacturing such an MMIC, the active element and passive element are manufactured by different manufacturing processes. For example, in the processes for manufacturing FET as an active element, a source electrode and a drain electrode composed of an ohmic metal AuGe/Au respectively are formed and a gate electrode composed of a Schottky metal Ti/Pt/Au is formed between these electrodes in an active area on a GaAs substrate.

On the other hand, in the MIM capacitor, a lower electrode composed of a Al or Ti/Al metal film is formed on the GaAs substrate and a dielectric layer composed of an SiN film, for example, is formed on the lower electrode. The SiN film is formed also on a surface of the FET. Then, an upper electrode composed of Ti/Pt/Au, for example, is formed on the SiN film. Upper electrodes are formed also on the surfaces of the source, drain and gate electrodes of the FET via contact holes formed in the SiN film. Thus the MMIC is completed.

However, in the MMIC having such structure as mentioned above, the step for forming the lower electrode of the MIM capacitor is carried out as a separate step from the step for forming the FET elements. Thus, the whole manufacturing steps become longer, resulting in low throughput. The reason why the manufacturing steps of the two must be different from each other is that the lower electrode of the MIM capacitor and the electrodes of the FET must be formed by different metallic materials. Therefore, a semiconductor device is desired, which realizes short manufacturing steps and enhances reliability of active and passive element portions.

One of the objects of the present invention is to provide an element structure of the MMIC having the active element and MIM capacitor enabling a reduction in the number of the manufacturing steps of the MMIC and also to provide a manufacturing method therefor.

DISCLOSURE OF THE INVENTION

A semiconductor device according to a first aspect of the present invention including a field effect transistor portion having a source area, a drain area and a gate electrode provided between the source area and the drain area and an MIM capacitor portion having a dielectric layer arranged between a lower electrode and an upper electrode is provided on a semiconductor substrate, wherein the gate electrode of the field effect transistor portion and the lower electrode of the MIM capacitor portion have the same electrode structure.

A semiconductor device according to a second aspect of the present invention includes an active element and an MIM capacitor having a dielectric layer arranged between a lower electrode and an upper electrode are formed on the semiconductor substrate, wherein the lower electrode of the MIM capacitor has a plurality of metal layers laminated and that the plurality of metal layers includes an Au layer, a Ti layer which is an uppermost layer and a barrier metal layer arranged between the Au layer and the Ti layer.

According to a third aspect of the present invention, the manufacturing method for a semiconductor device according to the first aspect aforementioned is provided. That is, the manufacturing method for a semiconductor device which includes a field effect transistor portion having a source area, a drain area and a gate electrode provided between the source area and the drain area and an MIM capacitor portion having a dielectric layer arranged between a lower electrode and an upper electrode is provided, including steps of forming the source area and the drain area of the field effect transistor on a semiconductor substrate, forming a source electrode in the source area, forming a drain electrode in the drain area, and forming the gate electrode of the field effect transistor and the lower electrode of the MIM capacitor simultaneously using a lift-off method.

According to the present invention, the Schottky metal electrode is used for the lower electrode of the MIM capacitor, and thus the lower electrode can be formed simultaneously with the Schottky electrode of the active element such as the field effect transistor. The manufacturing steps are shortened and the throughput is improved. Further, according to the present invention, a semiconductor device with the reliability of the MIM capacitor portion improved can be obtained since the Au/barrier metal film/Ti used as a lower electrode of the MIM capacitor has an excellent heat resistance.

DETAILED DESCRIPTION OF THE INVENTION

Figure 1:
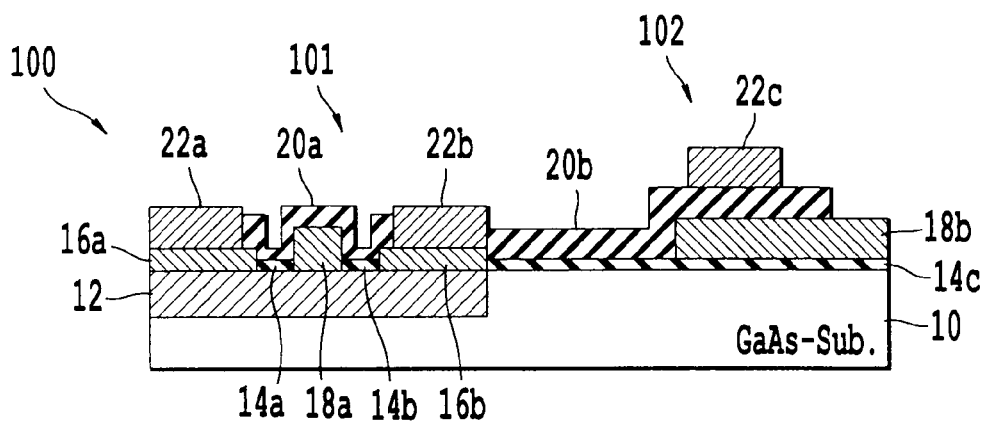
FIG. 1 is a schematic cross sectional view of the MMIC according to an embodiment the present invention.

The embodiment of the present invention will be explained in detail with reference to the accompanied drawings. The cross sectional view showing the schematic structure of the MMIC which is an embodiment of the semiconductor device is shown in FIG. 1. An MMIC 100 has a structure that an FET element portion 101 as an active element portion and an MIM capacitor portion 102 are formed on a GaAs substrate 10 which is the same compound semiconductor substrate.

The FET element portion 101 is formed on an active layer (channel layer) 12 formed on the GaAs substrate 10. Namely, on the active layer 12, a pair of insulating films 14a and 14b is formed at a predetermined interval. A source electrode 16a and a drain electrode 16b are formed on the active layer 12 on both sides of the pair of insulating films 14a and 14b. Further, a gate electrode 18a is formed between the pair of insulating films 14a and 14b on the active layer 12. A surface protective film 20a is formed so as to cover the pair of insulating films 14a and 14b and gate electrode 18a and a part of the source electrode 16a and drain electrode 16b. Upper electrodes 22a and 22b are formed on portions not covered by the surface protective film 20a on the source electrode 16a and drain electrode 16b respectively.

Further, the MIM capacitor portion 102 is formed on an insulating film 14c provided on the GaAs substrate 10. A lower electrode 18b is formed in a predetermined area on the insulating film 14c. A dielectric layer 20b is provided on the insulating film 14c, so as to cover the area where the lower electrode 18b is not formed and a predetermined area of the lower electrode 18b. On the dielectric layer 20b, an upper electrode 22c is so formed as to hold the dielectric layer 20b between it and the lower electrode 18b.

The manufacturing method for the MMIC 100 having such a structure will be explained by referring to FIGS. 2A to 2H which are drawings of the manufacturing steps.

Figure 2A:
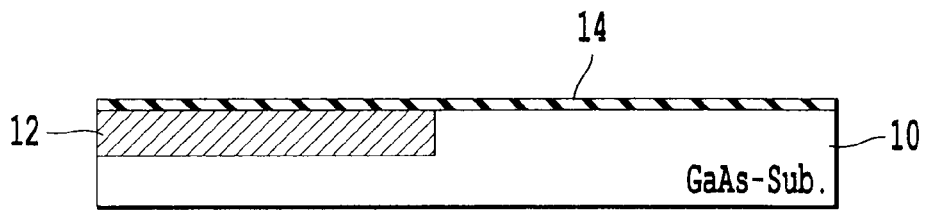
FIG. 2A is a diagram showing a first step of the manufacturing method for the MMIC shown in FIG. 1.

Firstly, as shown in FIG. 2A, an insulating film 14 is formed on the GaAs substrate 10 with the active layer 12 formed. The insulating layer 14 is provided to separate the lower electrode 18b of the MIM capacitor portion from the GaAs substrate 10, so as to prevent a leak current between them and a reduction in withstand voltage. Therefore, when such a leak current does not influence the characteristics of the MMIC 100, the insulation film 14 is not always necessary.

Figure 2B:
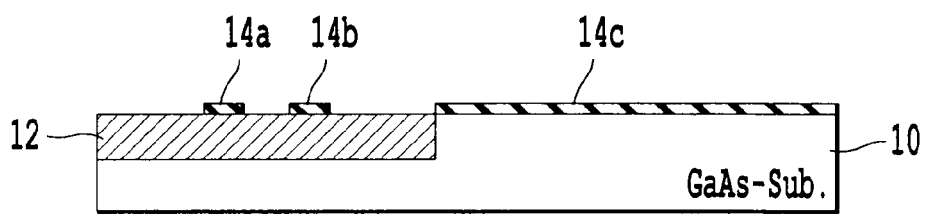
FIG. 2B is a diagram showing a second step of the manufacturing method for the MMIC shown in FIG. 1.

As shown in FIG. 2A, when the insulating film 14 is formed on the GaAs substrate 10, as shown in FIG. 2B, a part of the insulating film 14 on the active layer 2 is removed by etching to form an opening to reserve an area for forming the source electrode, drain electrode, and gate electrode in the FET element portion. Thus, the insulating film 14 is divided into plural insulating films 14a to 14c. Here, the insulating films 14a to 14c may be formed using the lift-off method depending on the material used for the insulating film 14.

Figure 2C:
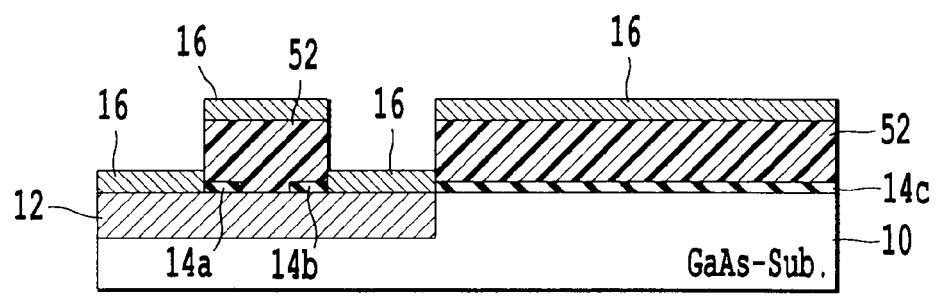
FIG. 2C is a diagram showing a third step diagram of the manufacturing method for the MMIC shown in FIG. 1.

Then, a resist film 52 is formed, in which areas for forming the source electrode and drain electrode are opened as shown in FIG. 2C. The resist film 52 is formed by coating an overall area with a resist film and then exposing and developing the resist film applying a photolithographic technology using a mask pattern. Thereafter, a metal film 16 for ohmic contact is deposited overall surface of the resist film 52. AuGe/Au is preferably used for the metal film 16.

Figure 2D:
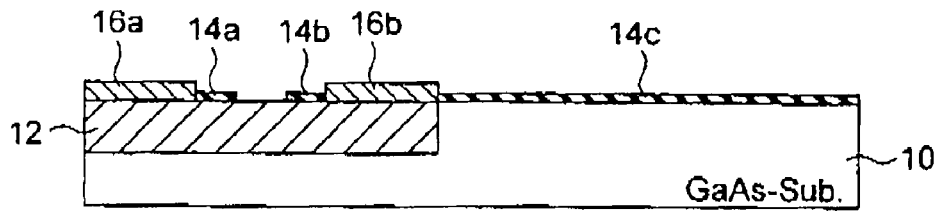
FIG. 2D is a diagram showing a fourth step of the manufacturing method for the MMIC shown in FIG. 1.

Next, the resist film 52 and the metal film 16 on the resist film 52 are removed by the lift-off method, as shown in FIG. 2D. Then, heat treatment (alloying) is performed so as to permit the metal film 16 to make ohmic contact with the active layer 12. Thus, the source electrode 16a and drain electrode 16b are formed on both sides of the insulating films 14a and 14b.

Figure 2E:
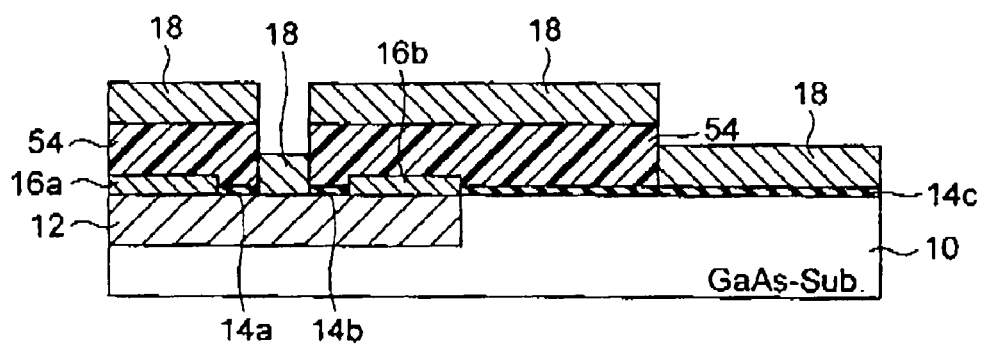
FIG. 2E is a diagram showing a fifth step of the manufacturing method for the MMIC shown in FIG. 1.
Figure 2F:
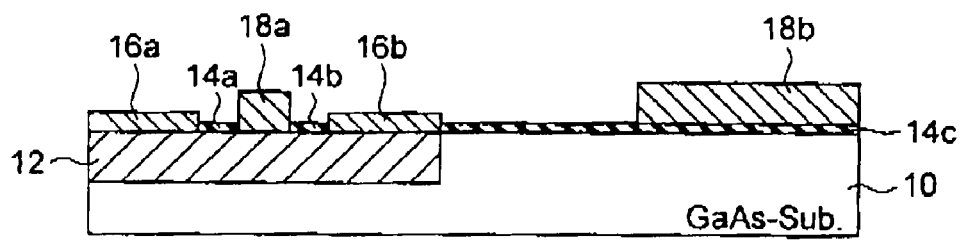
FIG. 2F is a diagram showing a sixth step of the manufacturing method for the MMIC shown in FIG. 1.

Next, a resist film 54 is formed, in which an area for forming the gate electrode of the FET element portion and for an area for forming the lower electrode of the MIM capacitor portion are opened, as shown in FIG. 2E. Ti/Pt/Au/Pt/Ti is preferably deposited on an overall surface of the resist film 54 for a metal film 18. Then, the resist film 54 and the metal film 18 thereon are removed by the lift-off method, as shown in FIG. 2F. Thus, the gate electrode 18a and the lower electrode 18b of the MIM capacitor portion are formed simultaneously.

As mentioned above, the gate electrode 18a of the FET element portion and the lower electrode 18b of the MIM capacitor portion are formed simultaneously, so that the number of manufacturing steps can be reduced and the throughput is improved.

Among the metal layers forming the gate electrode 18a, the Ti layer on the active layer 12 is selected to secure adhesion with the active layer 12 and the satisfactory Schottky characteristic. In place of the Ti layer, a metal layer composed of WSi or Al can be used, though it is desirable to avoid use of Al from the aspect of giving a high heat resistance to the lower electrode 18b of the MIM capacitor portion.

Further, the Pt layer between the Ti layer on the active layer 12 and the intermediate Au layer is a barrier metal layer for preventing a reaction of Ti to Au at high temperature. The barrier metal layer is not limited to the Pt layer but may be a single layer film of single metal selected from Mo, Pd, W, and Ta or a metal film including two or more kinds of different metals (that is, a multi-layer film).

The Au layer composing the gate electrode 18a is inserted for the purpose of reducing the electric resistance of the gate electrode 18a. The gate electrode of the FET is generally composed of such Ti/Pt/Au, though in the FET element portion of the MMIC 100, Pt/Ti is additionally formed. The Ti layer which is an uppermost layer of the gate electrode 18a plays a roll in increasing the adhesion with the surface protective film 20a, for example, composed of an SiN film.

Further, the Ti layer which is an uppermost layer of the lower electrode 18b of the MIM capacitor portion plays a roll of increasing the adhesion with the dielectric layer 20b composed of an SiN film, for example. Thus, the reliability of the MIM capacitor is improved.

Pt inserted under the Ti layer which is an uppermost layer of the gate electrode 18a is also a barrier metal layer for preventing a reaction of Ti with Au at high temperature. Also here, the barrier metal layer is not limited to the Pt layer but may be a layer composed of one or a plurality of metals selected from Mo, Pd, W, and Ta. The lower electrode 18b of the MIM capacitor also has such a barrier metal layer, so that a stable MIM capacitor can be formed, which is capable of withstanding high temperature treatment.

Figure 2G:
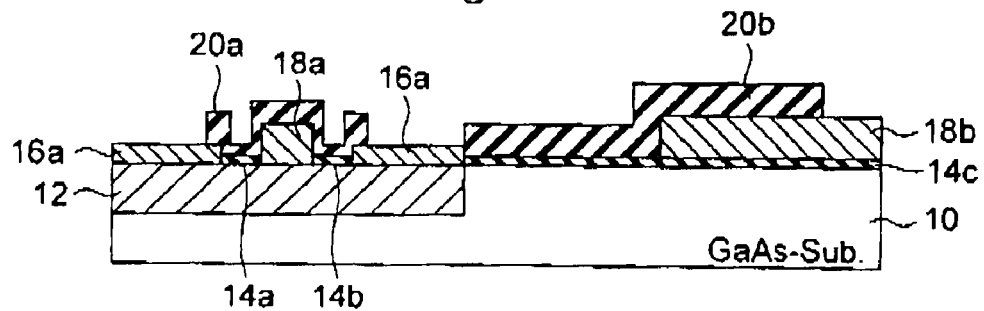
FIG. 2G is a diagram showing a seventh step of the manufacturing method for the MMIC shown in FIG. 1.

Next, the surface protective film 20a and dielectric layer 20 are simultaneously formed on the FET element portion and MIM capacitor portion respectively, as shown in FIG. 2G. These surface protective film 20a and dielectric layer 20 can be formed by laminating an SiN film, for example, overall the surface, then forming contact holes for the source electrode 16a and drain electrode 16b of the FET element portion and a contact hole (not shown) for the gate electrode 18 using an etching mask such as a resist film, and then removing the etching mask.

The surface protective film 20a of the FET element portion and the dielectric layer 20b of the MIM capacitor portion can be thus formed simultaneously, so that the number of the manufacturing steps can be reduced and the throughput can be improved.

Figure 2H:
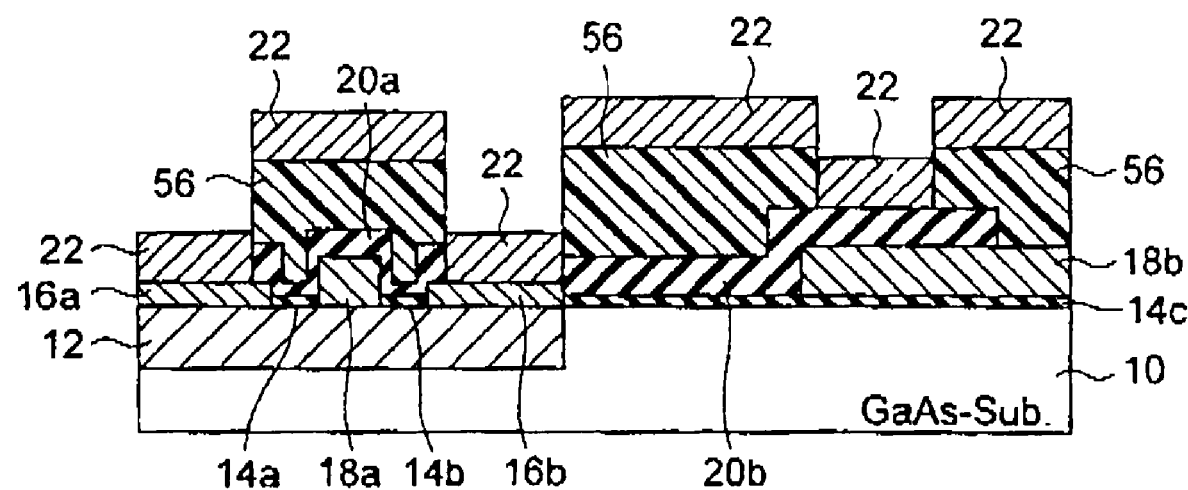
FIG. 2H is a diagram showing an eighth step of the manufacturing method for the MMIC shown in FIG. 1.

Thereafter, as shown in FIG. 2H, a resist film 56 is coated all over the surface excluding a part of the surfaces of the source electrode 16a and drain electrode 16b, a part (not shown) of the surface of the gate electrode 18a, a predetermined area of the dielectric layer 20b on the lower electrode 18b, and a part (not shown) of the surface of the lower electrode 18b. A metal film 22 composed of, for example, Ti/Pt/Au is deposited on all over the surface including the surface of the resist film 56. Here, the Ti layer is formed on the dielectric layer 20b in the MIM capacitor portion, and thus high adhesion can be obtained between them.

Thereafter, the resist film 56 and metal film 22 thereon are removed by the lift-off method. As a result, the upper electrodes 22a and 22b of the drain electrode 16a and source electrode 16b, the upper electrode (not shown) of the gate electrode 18a, and the upper electrode 22c and metallic wiring (not shown) connected to the lower electrode 18b of the MIM capacitor, which are shown in FIG. 1 are formed and thus the MMIC 100 shown in FIG. 1 is completed.

As mentioned above, the MMIC 100 does not need separate manufacturing processes for the FET element portion and MIM capacitor portion causing an increase in the number of conventional manufacturing steps of the MMIC, so that the throughput is improved and the reliability of the MIM capacitor is enhanced.

Though the embodiment of the present invention is explained above, the present invention is not limited to the embodiment described above. As a semiconductor substrate, a substrate having a GaN substrate as an active area can be used in addition to the GaAs substrate. As a substrate on which the active areas are formed, an insulating substrate such as sapphire or a semiconductor substrate such as SiC or Si can be used.

What is claimed is:

1. A semiconductor device comprising:
    a field effect transistor portion formed in an active area formed on a semiconductor substrate, and
    an MIM capacitor portion formed in a different area from the active area on the semiconductor substrate,
    wherein the field effect transistor portion includes a source electrode, a drain electrode separated from each other in the active area and a gate electrode formed between the electrodes,
    wherein the MIM capacitor portion includes a lower electrode formed on the semiconductor substrate, a dielectric layer formed on the lower electrode and an upper electrode formed on the dielectric layer,
    wherein the gate electrode of the field effect transistor portion and the lower electrode of the MIM capacitor portion are formed with substantially same electrode material, and
    wherein the gate electrode of the field effect transistor portion and the lower electrode of the MIM capacitor portion include an Au layer formed on the semiconductor substrate, a barrier metal layer laminated on the Au layer, and a Ti layer laminated on the barrier metal layer.

2. A semiconductor device according to claim 1, wherein the semiconductor substrate is a semi-insulating substrate.

3. A semiconductor device according to claim 2, wherein the barrier metal layer is a single layer film of one kind of metal selected from Pt, Mo, Pd, W, and Ta or a metal film including two or more kinds of metals.

4. A semiconductor device according to claim 3, wherein the source and drain electrodes of the field effect transistor portion are formed with AuGe/Au.

5. A semiconductor device according to claim 1, wherein the source and drain electrodes of the field effect transistor portion are formed with AuGe/Au 6. A method for manufacturing a semiconductor device with a field effect transistor and an MIM capacitor formed on a semiconductor substrate, wherein a source electrode and a drain electrode are formed respectively in a source area and a drain area of the field effect transistor and then a gate electrode of the field effect transistor and a lower electrode of the MIM capacitor are formed simultaneously,
    wherein the gate electrode of the field effect transistor and the lower electrode of the MIM capacitor are formed by laminating a plurality of metal layers so as to include at least an Au layer formed on the semiconductor substrate, a barrier metal layer laminated on the Au layer, and a Ti layer laminated on the barrier metal layer, and
    wherein a single layer film of one kind of metal selected from Pt, Mo, Pd, W, and Ta or a metal film including two or more kinds of metal is formed as the barrier metal layer.

7. The method for manufacturing a semiconductor device according to claim 6, comprising:
    forming the gate electrode and the lower electrode of the MIM capacitor using a lift-off method; and
    forming the drain electrode, the source electrode and the upper electrode of the MIM capacitor using a lift-off method.

8. The method for manufacturing a semiconductor device with a field effect transistor and an MIM capacitor formed on a semi-insulating semiconductor substrate comprising:
    forming an active layer on a part of the semiconductor substrate;
    forming an insulating film at a portion of the active layer excluding a forming area of the source, drain, and gate electrodes composing the field effect transistor and at a portion of the semiconductor substrate excluding the active layer;
    forming a first resist film on the insulating film so that the source and drain electrode forming area has an opening;
    forming a first metal film over the surface of the device including the first resist film for making ohmic contact with the active layer via the first resist film;
    separating the resist film and the first metal film thereon by a lift-off method, thereby forming the source and drain electrodes;
    heating the semiconductor substrate so as to form ohmic contact between the source and drain electrodes and the active layer;
    forming a second resist film so that a forming area of the lower electrode of the MIM capacitor has an opening in a portion excluding the forming area of the source electrode and the forming area of the active layer on the semiconductor substrate where the source and drain electrodes are formed;
    forming a second metal film over the surface of the device including the second resist film;
    separating the second resist film and the second metal film thereon by the lift-off method, thereby forming the gate electrode and the lower electrode of the MIM capacitor; and
    forming an upper electrode of the source and drain electrodes and an upper electrode of the MIM capacitor simultaneously.

9. A manufacturing method for a semiconductor device according to claim 8, further comprising:
    forming a dielectric layer, at a portion excluding a part of surfaces of the source, drain, and gate electrodes in the field effect transistor forming area, and at a portion of the lower electrode of the MIM capacitor;

forming a third resist film on the dielectric layer so that a part of the surfaces of the source, drain, and gate electrodes and a part of the lower electrode of the MIM capacitor have an opening;

forming a third metal film on all the surface of the third resist film; and separating the third resist film and the third metal film thereon by the lift-off method, thereby forming the upper electrodes connected to the source and drain electrodes and an upper electrode of the MIM capacitor.

10. The method for manufacturing a semiconductor device according to claim 9, wherein the gate electrode of the field effect transistor and the lower electrode of the MIM capacitor include an Au layer formed on the semiconductor substrate, a barrier metal layer laminated on the Au layer, and a Ti layer laminated on the barrier metal layer.

11. The method for manufacturing a semiconductor device according to claim 10, wherein the semi-insulating semiconductor substrate is a GaAs substrate.

12. The method for manufacturing a semiconductor device according to claim 11, wherein the barrier metal layer is a single layer film composed of one or more than one metal selected from Pt, Mo, Pd, W, and Ta.

13. The method for manufacturing a semiconductor device according to claim 9, wherein the third metal film is formed by Ti/P1/Au.

14. The method for manufacturing a semiconductor device according to claim 13, wherein the dielectric layer is formed with SiN.

* * * * *